United States Patent
Mo et al.

(10) Patent No.: US 9,054,751 B2
(45) Date of Patent: Jun. 9, 2015

(54) WIDEBAND TRANSMITTER FRONT-END

(71) Applicant: Aviacomm Inc., Sunnyvale, CA (US)

(72) Inventors: Shih Hsiung Mo, San Jose, CA (US); Yan Cui, Plano, TX (US); Chung-Hsing Chang, Milpitas, CA (US)

(73) Assignee: AVIACOMM INC., Santa Clara, CA (US)

( * ) Notice: Subject to any disclaimer, the term of this patent is extended or adjusted under 35 U.S.C. 154(b) by 0 days.

(21) Appl. No.: 14/250,001

(22) Filed: Apr. 10, 2014

(65) Prior Publication Data
US 2014/0220915 A1    Aug. 7, 2014

Related U.S. Application Data

(63) Continuation of application No. 13/363,056, filed on Jan. 31, 2012, now Pat. No. 8,699,974.

(60) Provisional application No. 61/526,853, filed on Aug. 24, 2011.

(51) Int. Cl.
| | |
|---|---|
| *H04B 1/04* | (2006.01) |
| *H04L 27/00* | (2006.01) |
| *H03F 1/22* | (2006.01) |
| *H03F 3/193* | (2006.01) |
| *H03F 3/21* | (2006.01) |
| *H03F 3/24* | (2006.01) |
| *H03F 3/72* | (2006.01) |
| *H04B 17/00* | (2006.01) |

(52) U.S. Cl.
CPC .............. *H04B 1/04* (2013.01); *H04L 27/0002* (2013.01); *H03F 1/223* (2013.01); *H03F 3/193* (2013.01); *H03F 3/211* (2013.01); *H03F 3/245* (2013.01); *H03F 3/72* (2013.01); *H03F 2203/7209* (2013.01); *H04B 2001/0408* (2013.01)

(58) Field of Classification Search
CPC ....................................................... H04B 1/0483
USPC ............................. 455/127.1–127.4; 330/295
See application file for complete search history.

(56) References Cited

U.S. PATENT DOCUMENTS

| | | | | |
|---|---|---|---|---|
| 5,847,607 A | * | 12/1998 | Lewicki et al. | ............... 330/258 |
| 5,973,557 A | | 10/1999 | Miyaji et al. | |
| 8,699,974 B2 | * | 4/2014 | Mo et al. | ................... 455/127.3 |
| 2007/0064833 A1 | | 3/2007 | Sahota | |

* cited by examiner

*Primary Examiner* — Lee Nguyen
(74) *Attorney, Agent, or Firm* — Shun Yao; Park, Vaughan, Fleming & Dowler LLP

(57) ABSTRACT

One embodiment of the present invention provides a transmitter for wireless communication. The transmitter includes a wideband tunable modulator, a number of power amplifiers with a particular power amplifier associated with a particular frequency range, and a wideband power amplifier (PA) driver. The PA driver is configured to receive an output signal from the wideband tunable modulator, amplify the output signal, and send the amplified output signal to at least one of the power amplifiers.

19 Claims, 5 Drawing Sheets

WIDEBAND TRANSMITTER FRONT-END

RELATED APPLICATIONS

This application is a continuation of U.S. application Ser. No. 13/363,056, entitled "WIDEBAND TRANSMITTER FRONT-END," by inventors Shih Hsiung Mo, Yan Cui, and Chung-Hsing Chang, filed 31 Jan. 2012, which claims the benefit of U.S. Provisional Application No. 61/526,853, entitled "Wideband Transmitter Front-End," by inventors Shih Hsiung Mo, Yan Cui, and Chung-Hsing Chang, filed 24 Aug. 2011.

BACKGROUND

1. Field

The present disclosure relates generally to the transmitter front-end of a wireless communication system. More specifically, the present disclosure relates to a novel low-power wideband transmitter front-end.

2. Related Art

Traditional wireless communication systems are usually designed for a specific standard, such as GSM (Global System for Mobile Communications) or Wideband Code Division Multiple Access (W-CDMA), each requiring different carrier frequencies. For example, the carrier frequency of the GSM signals varies from 800 MHz to 1 Ghz, while the carrier frequency of the W-CDMA signals varies between 2-3 GHz. Current demand for the convergence of wireless services, in which users can access different standards from the same wireless device, is driving the development of multi-standard and multi-band transceivers, which are capable of transmitting/receiving radio signals in the entire wireless communication spectrum (from 300 MHz to 3 GHz).

To meet multi-standard and multi-band requirements, the RF front-end (which includes circuitry between the antenna and the first intermediate frequency (IF) stage) needs to operate over a frequency range covering the entire wireless communication spectrum.

SUMMARY

One embodiment of the present invention provides a transmitter for wireless communication. The transmitter includes a wideband tunable modulator, a number of power amplifiers with a particular power amplifier associated with a particular frequency range, and a wideband power amplifier (PA) driver. The PA driver is configured to receive an output signal from the wideband tunable modulator, amplify the output signal, and send the amplified output signal to at least one of the power amplifiers.

In a variation on this embodiment, the transmitter further includes a single-pole multiple-throw switch situated between the wideband PA driver and the power amplifiers. The switch is configured to switch the amplified output signal to one of the power amplifiers based on a carrier frequency of the output signal.

In a variation on this embodiment, the wideband tunable modulator and the power amplifier are located on a same integrated circuit (IC) chip.

In a variation on this embodiment, the wideband tunable modulator is a quadrature modulator.

In a variation on this embodiment, the wideband tunable modulator has a tuning range between 300 MHz and 3.6 GHz.

In a further variation, the wideband tunable modulator includes an amplifier. The bandwidth of the amplifier is compensated for by using an inductive peaking technique.

In a variation on this embodiment, the wideband PA driver includes a cascode amplifier.

In a further embodiment, the cascode amplifier has two poles.

In a further embodiment, the cascode amplifier includes an inductor that is serially coupled to a parasitic capacitor.

In a further embodiment, the inductor has an inductance between 0.5 nH and 10 nH.

In a variation on this embodiment, the wideband PA driver has a 10 dB bandwidth that is up to 3.6 GHz.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide a solution for a low-power transmitter front-end. In one embodiment, the transmitter chip includes a wideband power-amplifier driver that is capable of amplifying RF (radio frequency) signals over a wide frequency range.

Wideband Transmitter Front-End

Figure 1:
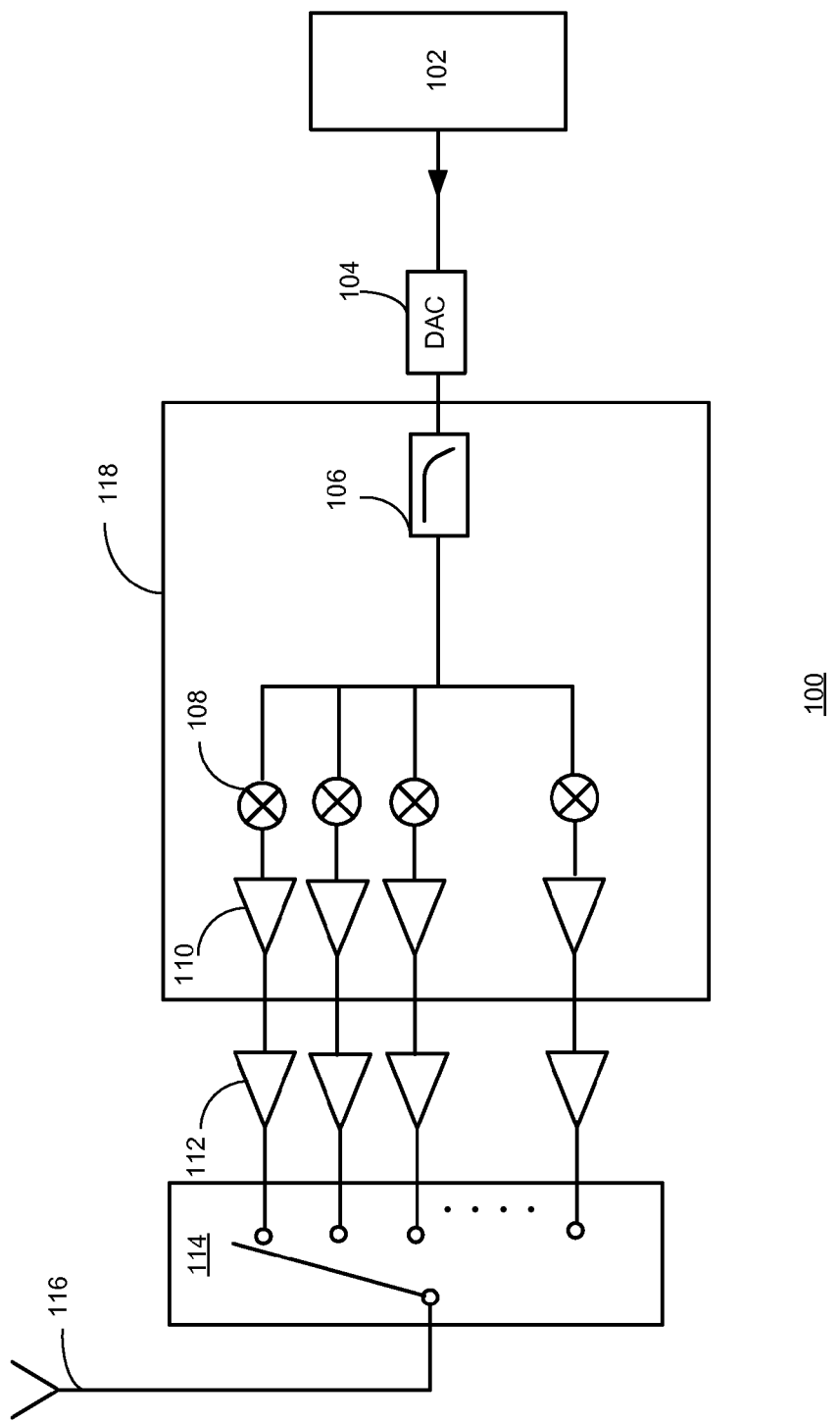
FIG. 1 presents a diagram illustrating the architecture of a conventional wireless transmitter (prior art).

FIG. 1 presents a diagram illustrating the architecture of a conventional wireless transmitter (prior art). Transmitter 100 includes a baseband signal processor 102, a digital-to-analog converter (DAC) 104, a low-pass filter (LPF) 106, a number of quadrature modulators (such as modulator 108), a number of power-amplifier (PA) drivers (such as PA driver 110), a number of PAs (such as PA 112), an n×1 switch 114, and an antenna 116.

During operation, baseband signals provided by baseband signal processor 102 are converted from the digital domain to the analog domain by DAC 104. LPF 106 filters out any out-of-band noise. Modulators operating at different frequencies modulate the baseband signal at different frequency bands. The output of a particular modulator, thus RF signal at a particular carrier frequency, is sent to a dedicated PA driver operating at that carrier frequency. For example, the output of modulator 108 is sent to PA driver 110, which is optimized to work at the operating frequency of modulator 108. The output of a PA driver is then sent to a corresponding PA (often located off-chip), which is also optimized to work at the same frequency band. Note that a PA driver needs to be able to deliver a considerable power to its corresponding PA, which has a 50 Ohm input impedance. For example, the output of PA driver 110 is sent to PA 112. Depending on the currently active standard or mode of operation, n×1 switch 114 selects the output of a desired PA, thus RF signal at the desired carrier frequency, and sends the RF signal to antenna 116 for transmission.

Note that, as shown in FIG. 1, the PA drivers (such as PA driver 110), the modulators (such as modulator 108) and LPF 106 are often integrated onto a single integrated circuit (IC) chip 118. With a dedicated modulator and a dedicated PA driver for each frequency band, the transmitter performance can be optimized for each frequency band. However, a large amount of chip area is required to accommodate the multiple PA drivers and modulators. In addition, a large number of input/output lines will be needed, which not only increases the chip size, but also the size of a supporting printed circuit board (PCB), thus significantly increasing the size of the packaged device.

Figure 2:
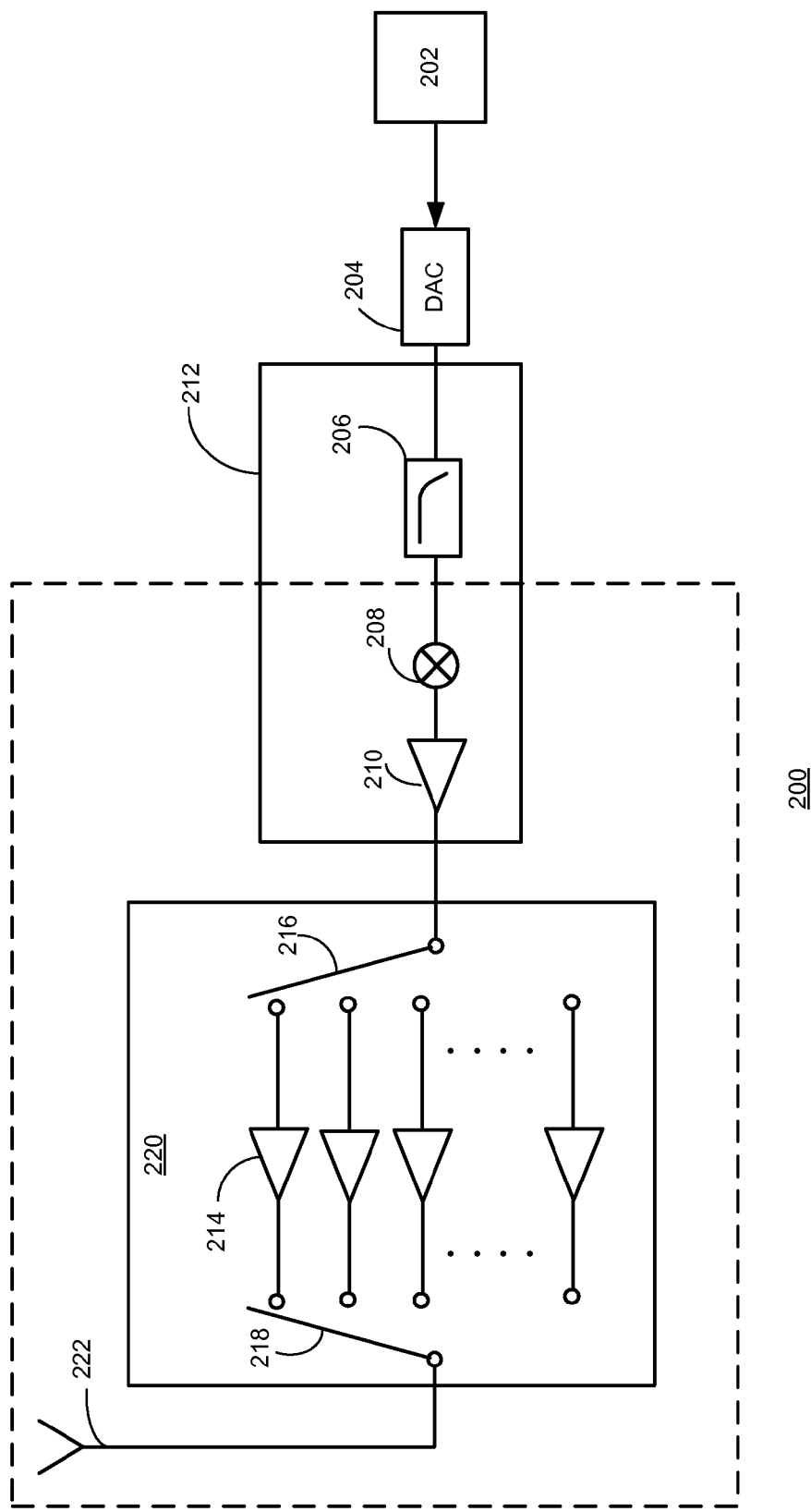
FIG. 2 presents a diagram illustrating the architecture of a wireless transmitter, in accordance with an embodiment of the present invention.

To reduce the size of the transmitter chip and the supporting PCB, it is desirable to use a single modulator and a single PA driver for the multiple frequency bands. FIG. 2 presents a diagram illustrating the architecture of a wireless transmitter, in accordance with an embodiment of the present invention. In FIG. 2, transmitter 200 includes a baseband signal processor 202, a DAC 204, a low-pass filter (LPF) 206, a tunable quadrature modulator 208, a wideband PA driver 210, a number of PAs (such as PA 214), a 1×n switch 216, an n×1 switch 218, and an antenna 222.

LPF 206, tunable modulator 208, and wideband PA driver 210 form transmitter chip 212, which has far fewer I/O lines than conventional transmitter chip 118. A 1×n switch 216, an n×1 switch 218, and the multiple PAs form a PA chip 220. 1×n switch 216 ensures that RF signals of a particular frequency band are sent to a corresponding narrowband PA, and n×1 switch 218 ensures that the output of the different PAs are sent to antenna 222 via a single input.

To enable multi-standard/multi-band application, tunable modulator 208 and wideband PA driver 210 need to have a bandwidth covering the entire wireless communication bandwidth, which is from 300 MHz all the way to 3.6 GHz. Hence, the tuning range of tunable modulator 208 needs to be between 300 MHz and 3.6 GHz. Such a wide bandwidth imposes a number of design challenges, especially for wideband PA drivers, which have a large dynamic range. On the other hand, the gain requirement for a mixer used inside a typical modulator is relatively low, making designing the modulator less difficult. In one embodiment, an inductive peaking technique is used to increase the bandwidth of an amplifier used in the mixer.

Figure 3B:
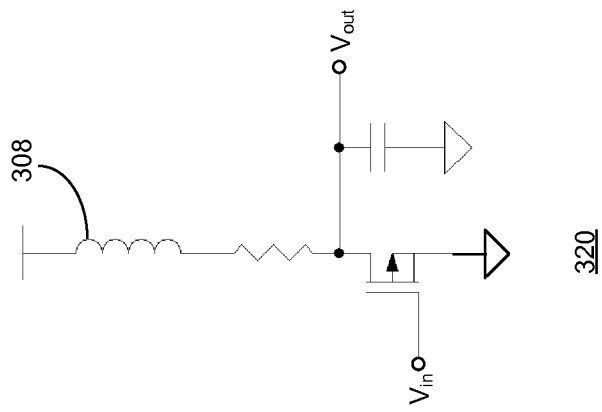
FIG. 3B presents a schematic of a mixer, in accordance with an embodiment of the present invention.
Figure 3A:
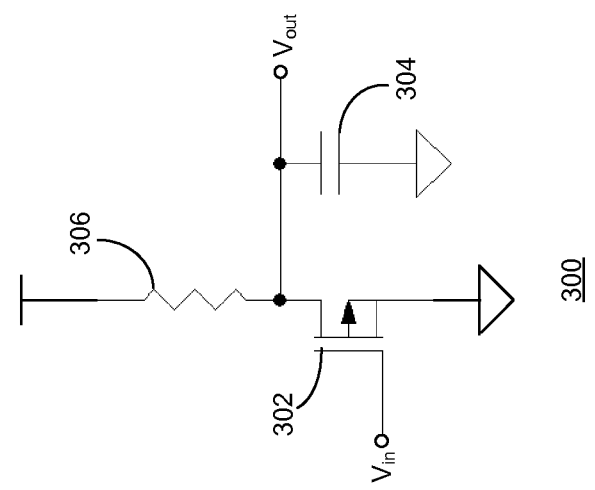
FIG. 3A presents a schematic of a conventional mixer (prior art).

FIG. 3A presents a schematic of a conventional amplifier used for a mixer (prior art). In FIG. 3A, amplifier 300 includes a transistor 302 and a resistor 306. Note that a capacitor 304 in FIG. 3A is the parasitic capacitance. An exemplary resistance of resistor 306 is 50 Ohm, and an exemplary capacitance of parasitic capacitor 304 is 800 fF. The bandwidth of amplifier 300 is limited by the existence of parasitic capacitor 304. More specifically, the gain curve of amplifier 300 dips at higher frequencies.

FIG. 3B presents a schematic of an amplifier in accordance with an embodiment of the present invention. Amplifier 320 has a similar structure compared with amplifier 300 except that amplifier 320 includes an additional inductor 308 situated between resistor 306 and the power supply. In one embodiment, the inductance of inductor 308 is 12 nH. Note that at lower frequencies, inductor 308 has minimum impact, and at higher frequencies (such as in the GHz range), inductor 308 resonates with parasitic capacitor 304, thus increasing the bandwidth of amplifier 320. In one embodiment, the bandwidth of amplifier 320 expands beyond 3 GHz.

Due to the large dynamic range of PA driver, inductive peaking is no longer an optimum solution for increasing the bandwidth of the PA driver because the resistance load (resistor 306) introduces voltage drop. In one embodiment, a double-pole solution is used to increase the bandwidth of an amplifier, such as an operational amplifier.

Figure 4B:
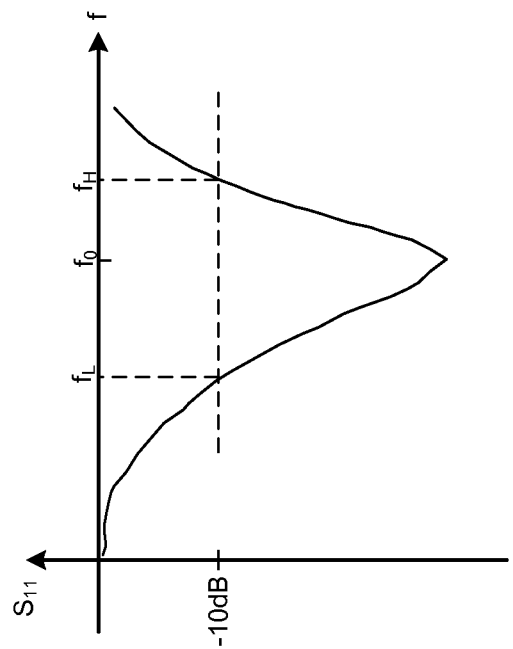
FIG. 4B presents a diagram illustrating an exemplary frequency response of the return loss for a conventional PA driver (prior art).
Figure 4A:
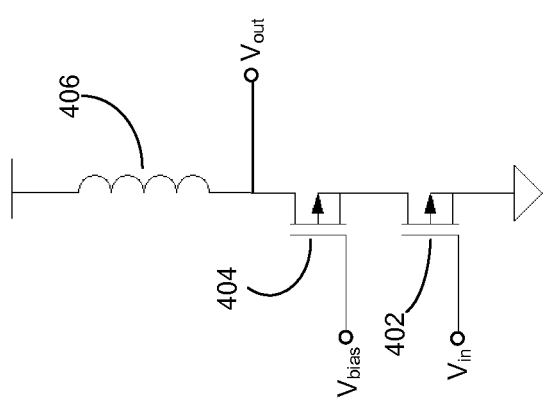
FIG. 4A presents a schematic of a conventional power amplifier (PA) driver (prior art).

FIG. 4A presents a schematic of a conventional power amplifier (PA) driver (prior art). PA driver 400 includes a pair of transistors 402 and 404, and an inductor 406. Transistors 402 and 404 form a cascode amplifier. The bandwidth of PA driver 400 is limited by parasitic effects. More specifically, parasitic capacitors resonate with inductor 406, causing the input return loss (the $S_{11}$ parameter) frequency response curve to dip at the resonance frequency (or the pole location). FIG. 4B presents a diagram illustrating an exemplary frequency response of the return loss for a conventional PA driver (prior art).

Figure 4D:
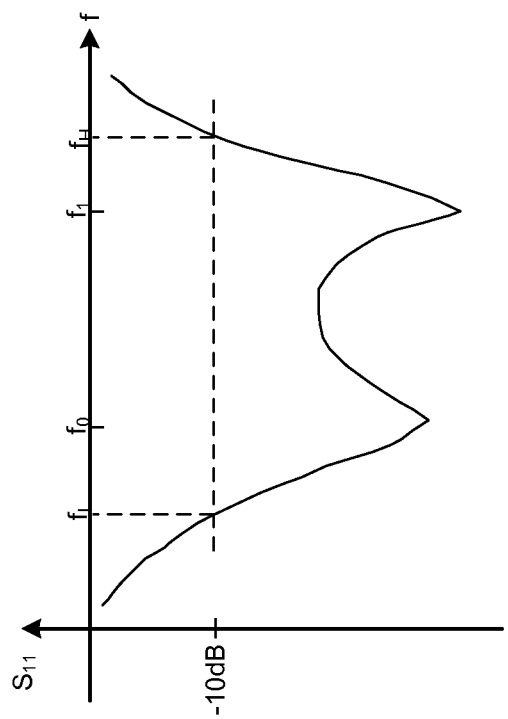
FIG. 4D presents a diagram illustrating an exemplary frequency response of the return loss for a wideband PA driver, in accordance with an embodiment of the present invention.
Figure 4C:
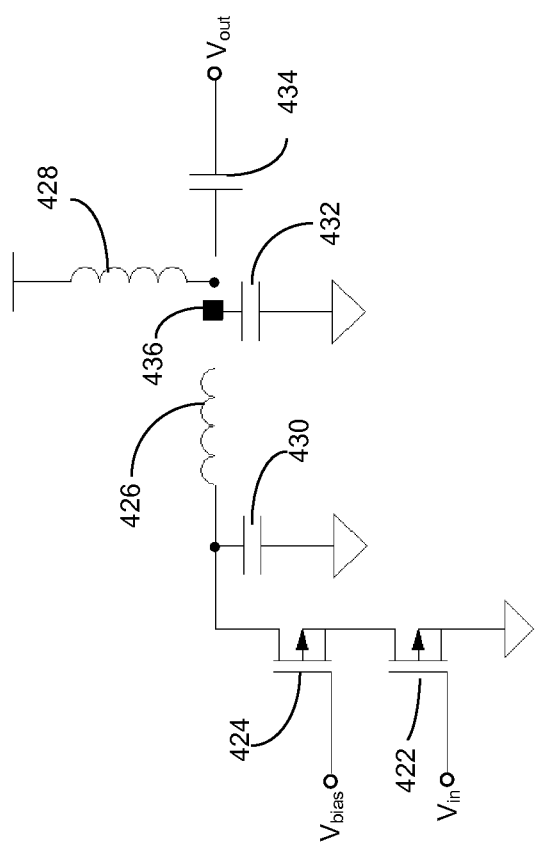
FIG. 4C presents a schematic of a wideband power amplifier (PA) driver, in accordance with an embodiment of the present invention.

FIG. 4C presents a schematic of a wideband power amplifier (PA) driver, in accordance with an embodiment of the present invention. Similarly to conventional PA driver 400, wideband PA driver 420 includes a cascode amplifier (transistors 422 and 424), a parasitic capacitor 430, and a choke inductor 428. Note that parasitic capacitor 430 may include an additional parallel capacitor. In addition, wideband PA driver 420 includes a serial inductor 426, a parallel capacitor 432, and a DC-block capacitor 434. Serial inductor 426 is situated between parasitic capacitor 430 and parallel capacitor 432, as shown in FIG. 4C. In one embodiment, parallel capacitor 432 is coupled to an output bond pad 436, and choke inductor 428 is located off-chip.

The added serial LC increases the bandwidth of wideband PA driver 420 because now there are two resonance frequencies (two poles), corresponding to two dips in the return loss frequency response curve. FIG. 4D presents a diagram illustrating an exemplary frequency response of the return loss for a wideband PA driver in response to an embodiment of the present invention. As one can see from FIG. 3D, the existence of the two poles (one at $f_0$ and another one at $f_1$) significantly increases the bandwidth of PA driver 420. In one embodiment, the bandwidth of the two-pole amplifier is 20% more than that of the conventional amplifier. By carefully selecting the values of inductors 426 and 428, on communication frequency range (up to 3.6 GHz). In one embodiment, the inductance of inductor 426 is between 0.5 nH and 10 nH, and the inductance of inductor 428 equals or is greater than 33 nH.

The wideband PA driver and wideband mixer allow the transmitter chip manufacturer to manufacture the same type of transmitter chips that can be sold to different markets where different standards are implemented, thus significantly reducing the designing and manufacturing cost.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A transmitter for wireless communication, comprising:
a single wideband tunable modulator having tuning range from 300 MHz all the way up to 3.6 GHz;
a number of power amplifiers, wherein a particular power amplifier is associated with a particular frequency band; and
a single wideband power amplifier (PA) driver coupled to the single wideband tunable modulator and the power amplifiers, wherein the single wideband PA driver is coupled to the power amplifiers via a band-selection switch, and wherein the single wideband PA driver is configured to:
receive an output signal from the wideband tunable modulator, wherein a frequency of the output signal is between 300 MHz and 3.6 GHz;
amplify the output signal; and
send the amplified output signal to at least one of the power amplifiers via the band-selection switch.

2. The transmitter of claim 1, further comprising a single-pole multiple-throw switch situated between the wideband PA driver and the power amplifiers, wherein the switch is configured to switch the amplified output signal to one of the power amplifiers based on a carrier frequency of the output signal.

3. The transmitter of claim 1, wherein the wideband tunable modulator and the power amplifiers are located on a same integrated circuit (IC) chip.

4. The transmitter of claim 1, wherein the wideband tunable modulator is a quadrature modulator.

5. The transmitter of claim 1, wherein the single wideband tunable modulator includes an amplifier, wherein a bandwidth of the amplifier is compensated for by using an inductive peaking technique.

6. The transmitter of claim 1, wherein the wideband PA driver includes a cascode amplifier.

7. The transmitter of claim 6, wherein the cascode amplifier has two poles.

8. The transmitter of claim 7, wherein the cascode amplifier includes an inductor that is serially coupled to a parasitic capacitor.

9. The transmitter of claim 8, wherein the inductor has an inductance between 0.5 nH and 10 nH.

10. The transmitter of claim 1, wherein the single wideband PA driver has a 10 dB bandwidth that is up to 3.6 GHz.

11. A method for generating a transmitter output for wireless communication, comprising:
receiving a baseband signal;
modulating the baseband signal onto an RF carrier, wherein the RF carrier has a frequency that ranges from 300 MHz to 3.6 GHz;
pre-amplifying the modulated signal using a single on-chip amplifier driver regardless of the RF carrier frequency, wherein the single on-chip amplifier driver is coupled to a group of power amplifiers via a band-selection switch; and
sending the pre-amplified modulated signal via the band-selection switch to a power amplifier selected from the group of power amplifiers based on the RF carrier frequency.

12. The method of claim 11, wherein modulating the baseband signal is performed by an on-chip tunable modulator.

13. The method of claim 12, wherein the on-chip tunable modulator includes an amplifier, wherein a bandwidth of the amplifier is compensated for by using an inductive peaking technique.

14. The method of claim 13, wherein the amplifier is a cascode amplifier.

15. The method of claim 11, wherein modulating the baseband signal involves quadrature modulating.

16. The method of claim 11, wherein pre-amplifying the modulated signal is performed by a cascode amplifier.

17. The method of claim 16, wherein the cascode amplifier has two poles.

18. The method of claim 17, wherein the cascode amplifier includes an inductor that is serially coupled to a parasitic capacitor.

19. The method of claim 18, wherein the inductor has an inductance between 0.5 nH and 10 nH.

* * * * *